United States Patent
Xu et al.

(10) Patent No.: US 7,570,109 B2
(45) Date of Patent: Aug. 4, 2009

(54) SYSTEM AND METHOD FOR DEMODULATING AMPLITUDE MODULATED SIGNALS

(75) Inventors: Lian-Chun Xu, Singapore (SG); Kok-Soon Yeo, Singapore (SG); Chee-Keong Teo, Singapore (SG); John Julius Asuncion, Singapore (SG); Wai Keat Tai, Singapore (SG)

(73) Assignee: Lite-On Technology Corp., Neihu, Taipei (TW)

( * ) Notice: Subject to any disclaimer, the term of this patent is extended or adjusted under 35 U.S.C. 154(b) by 0 days.

(21) Appl. No.: 11/266,916

(22) Filed: Nov. 4, 2005

(65) Prior Publication Data
US 2007/0205826 A1    Sep. 6, 2007

(51) Int. Cl.
*H04B 10/06* (2006.01)
(52) U.S. Cl. .................. 329/347; 398/106; 398/202
(58) Field of Classification Search ........... 398/106, 398/202; 329/347
See application file for complete search history.

(56) References Cited

U.S. PATENT DOCUMENTS

| 5,883,534 | A | * | 3/1999 | Kondoh et al. | 327/156 |
| 6,556,330 | B2 | * | 4/2003 | Holcombe | 398/202 |
| 6,677,732 | B1 | * | 1/2004 | Inoue et al. | 320/166 |
| 6,858,830 | B2 | * | 2/2005 | Suzuki et al. | 250/214 AG |
| 2005/0003786 | A1 | | 1/2005 | Inoue et al. | |
| 2005/0152705 | A1 | * | 7/2005 | Inoue et al. | 398/202 |

* cited by examiner

*Primary Examiner*—Robert J. Pascal
*Assistant Examiner*—James E Goodley
(74) *Attorney, Agent, or Firm*—Winston Hsu

(57) ABSTRACT

A system and method for demodulating amplitude modulated input signals uses two comparators and a charge pump circuit, which is positioned between the two comparators, to produce a demodulated signal of an amplitude modulated input signal. The two comparators and the charge pump circuit form a demodulating unit that may be a part of an infrared remote control receiver. The first comparator converts the input signal from a waveform to a pulse form. The charge pump circuit then converts the pulse signal into an integrated signal in a triangular pulse form. The second comparator converts the integrated signal from a triangular pulse form to a rectangular pulse form to produce the demodulated signal.

16 Claims, 5 Drawing Sheets

SYSTEM AND METHOD FOR DEMODULATING AMPLITUDE MODULATED SIGNALS

BACKGROUND OF THE INVENTION

Infrared remote control (RC) systems are commonly used in a variety of electronic appliances to allow users to remotely control and/or program the appliances. One of the most widely used electronic appliances with an infrared RC system is a television. Using the infrared RC system, a user can remotely change various settings of the television, such as channel, audio volume, and picture control levels.

An infrared RC system of an electronic appliance includes an infrared transmitter and an infrared receiver. The transmitter is typically included in a handheld remote control, which allows a user to input the desired setting for the appliance. The transmitter modulates the outgoing infrared signal typically using amplitude shift keying (ASK) in response to the user input. The receiver is included in the appliance to receive and demodulate the modulated infrared signal so that the microcontroller in the appliance can change the setting of the appliance according to the user input.

A conventional infrared RC receiver for ASK modulated infrared signals includes a photodetector, an amplifier, a limiter, a bandpass filter, a demodulator, an integrator with a capacitor and a comparator with hysteresis. When an ASK modulated infrared signal is received, the photodetector produces an electrical signal in response to the infrared signal. The electrical signal is amplified by the amplifier, which is then limited by the limiter to ensure the amplified signal is within the input range of the bandpass filter. The bandpass filter selectively filters the signal based on frequency so that components of the signal within a particular frequency range is transmitted, while other components of the signal is attenuated. The bandpass filtered signal is then demodulated by the demodulator, the integrator and the comparator with hysteresis.

A concern with the conventional infrared RC receiver is that out-band noise is not effectively suppressed. Another concern with the conventional infrared RC receiver is that the integrator requires a significantly large capacitor, which introduces various disadvantages such as increased manufacturing cost and increased power consumption.

In view of these concerns, what is needed is a system and method for demodulating amplitude modulated optical signals with improved noise performance that can demodulate using a smaller capacitor than a conventional infrared RC receiver.

SUMMARY OF THE INVENTION

A system and method for demodulating amplitude modulated input signals uses two comparators and a charge pump circuit, which is positioned between the two comparators, to produce a demodulated signal of an amplitude modulated input signal. The two comparators and the charge pump circuit form a demodulating unit that may be a part of an infrared remote control receiver. The first comparator converts the input signal from a waveform to a pulse form. The charge pump circuit then converts the pulse signal into an integrated signal in a triangular pulse form. The second comparator converts the integrated signal from a triangular pulse form to a rectangular pulse form to produce the demodulated signal.

A system for demodulating amplitude modulated signals comprise first and second comparators and a charge pump circuit. The first comparator is configured to convert an amplitude modulated input signal from a waveform to a pulse form using upper and lower threshold signals. The charge pump circuit is electrically connected to the first comparator. The charge pump circuit is configured to charge and discharge current in response to the input signal in the pulse form to produce an integrated signal in a triangular pulse form. The second comparator is electrically connected to the charge pump circuit to receive the integrated signal. The second comparator is configured to convert the integrated signal from the triangular pulse form to a rectangular pulse form using a reference signal to produce a demodulated output signal.

A system for demodulating amplitude modulated signals in accordance with another embodiment of the invention comprises a photodetector, a bandpass filter and a demodulation unit. The photodetector is used to receive an amplitude modulated optical signal and generate an electrical input signal in response to the optical signal. The bandpass filter is electrically connected to the photodetector. The bandpass filter is configured to transmit and attenuate components of the input signal based on frequency. The demodulation unit is electrically connected to the bandpass filter. The demodulation unit is configured to convert the input signal from the bandpass filter from a waveform to a pulse form. The demodulation unit is further configured to charge and discharge current in response to the input signal in the pulse form to produce an integrated signal in a triangular pulse form. The demodulation unit is further configured to convert the integrated signal from the triangular pulse to a rectangular pulse form to produce a demodulated output signal.

A method for demodulating amplitude modulated signals in accordance with an embodiment of the invention comprises receiving an amplitude modulated input signal, converting the input signal from a waveform to a pulse form, charging and discharging current in response to the input signal in the pulse form to produce an integrated signal in a triangular pulse form, and converting the integrated signal from the triangular pulse form to a rectangular pulse form to produce a demodulated output signal.

Other aspects and advantages of the present invention will become apparent from the following detailed description, taken in conjunction with the accompanying drawings, illustrated by way of example of the principles of the invention.

DETAILED DESCRIPTION

Figure 1:
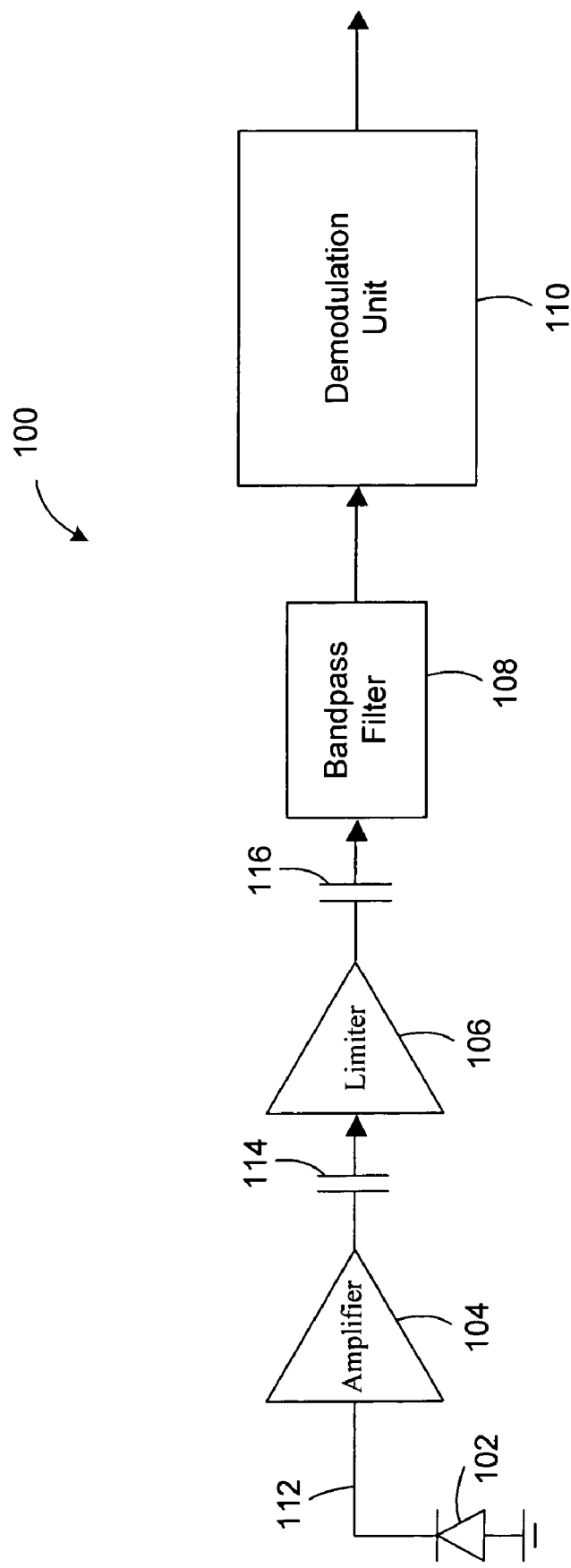
FIG. 1 is a block diagram of an infrared remote control (RC) receiver in accordance with an embodiment of the invention.

With reference to FIG. 1, an infrared remote control (RC) receiver 100 in accordance with an embodiment of the invention is described. The infrared RC receiver 100 is designed to receive and demodulate infrared optical signals, which have been modulated using, for example, amplitude shift keying (ASK). As described in more detail below, the infrared RC receiver 100 is designed to better suppress out-band signal than a comparable conventional infrared RC receiver. Furthermore, the infrared RC receiver 100 requires a smaller capacitor to demodulate the received signals than the conventional infrared RC receiver.

As shown in FIG. 1, the infrared RC receiver 100 includes a photodetector 102, an amplifier 104, a limiter 106, a bandpass filter 108 and a demodulation unit 110. The photodetector 102 generates an electrical signal in the form of electrical current on a signal path 112 in response to an amplitude modulated infrared optical signal received by the photodetector. As an example, the photodetector 102 may be a photodiode. The amplifier 104 receives the electrical signal from the photodetector 102 and amplifies the electrical signal. The limiter 106 receives the amplified signal from the amplifier 104 and limits the amplitude of the amplified signal using a threshold voltage. The threshold voltage used by the limiter 106 should be low enough so that the maximum amplitude of the output signal is within the input voltage range of the bandpass filter 108. The bandpass filter 108 receives the output signal from the limiter 106 and filters the signal so that components of the signal with frequencies in a desired range or frequency band are transmitted, while components of the signal with frequencies out of the desired range or frequency band are attenuated. The bandpass filtered signal is then transmitted to the demodulation unit 110, which demodulates the signal, as described below. The demodulated signal is transmitted to downstream components (not shown) for further processing.

As further shown in FIG. 1, the infrared RC receiver 100 includes capacitors 114 and 116 connected in series on the signal path 112. The capacitor 114 is positioned between the amplifier 104 and the limiter 106. The capacitor 116 is positioned between the limiter 106 and the bandpass filter 108. The capacitors 114 and 116 allow AC signals to pass, while blocking DC signals.

Figure 2:
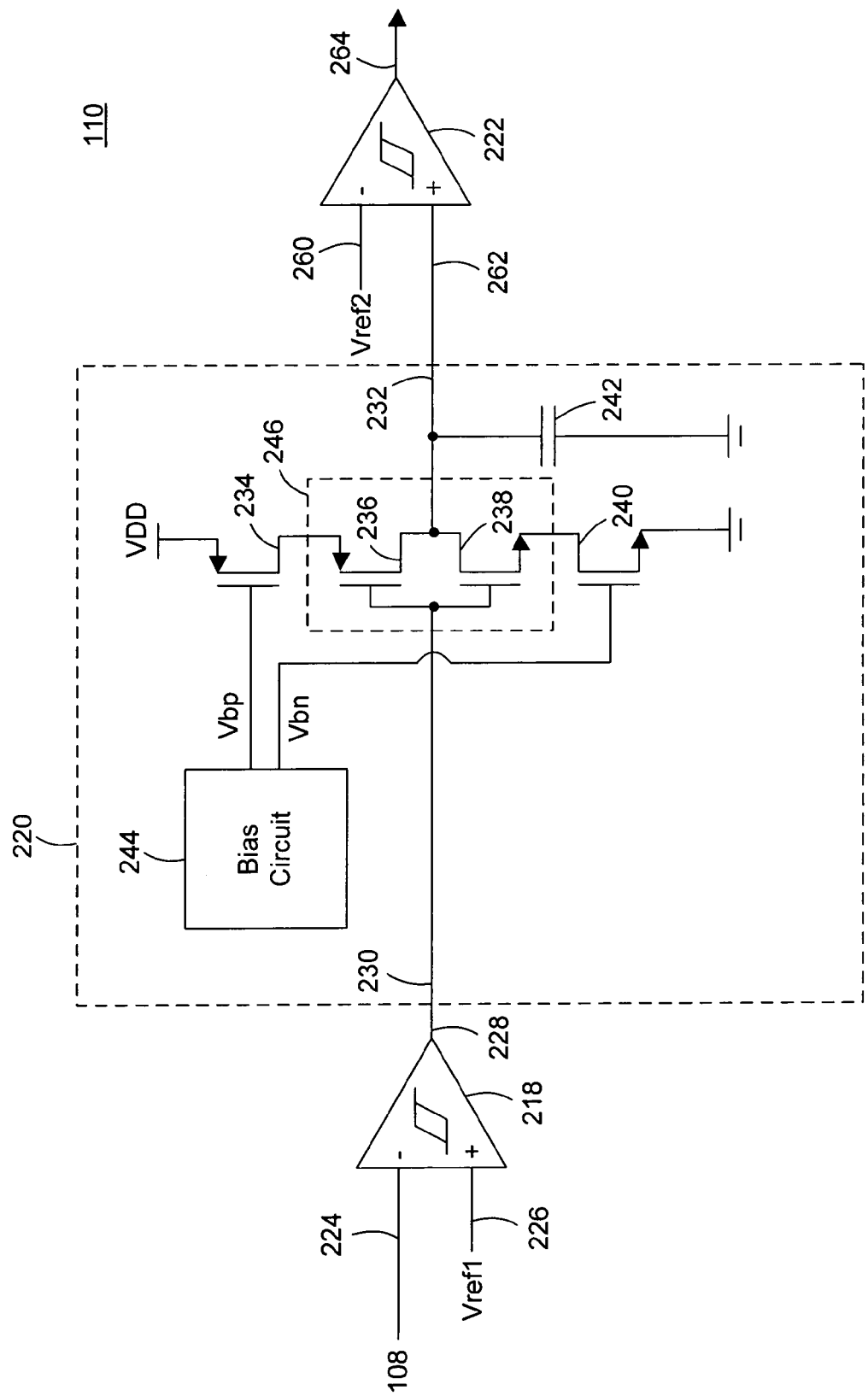
FIG. 2 is a circuit diagram of a demodulation unit included in the infrared RC receiver of FIG. 1 in accordance with an embodiment of the invention.

Turning now to FIG. 2, the components of the demodulation unit 110 in accordance with an embodiment of the invention are shown. The demodulation unit 110 includes a first comparator 218 with hysteresis, a charge pump circuit 220 and a second comparator 222 with hysteresis. The first comparator 218 includes two inputs 224 and 226, and a single output 228. The input 224 is connected to the bandpass filter 108 to receive the input signal, which has been filtered by the bandpass filter. The input signal from the bandpass filter 108 is a waveform signal. The input 226 is connected to receive a reference voltage signal Vref1. The Vref1 reference signal defines the positive (upper) and negative (lower) hysteresis threshold voltages of the first comparator 218. The output 228 is connected to the charge pump circuit 220. The first comparator 218 operates to receive an input waveform signal from the bandpass filter 108 and to convert the input signal to an output signal in a pulse form using the upper and lower hysteresis threshold voltages defined by the Vref1 reference signal.

The charge pump circuit 220 includes an input 230, an output 232, four transistors 234, 236, 238 and 240, a capacitor 242 and a bias circuit 244. The transistors 234, 236, 238 and 240 are connected in series between a supply voltage (VDD) terminal and electrical ground. In this embodiment, the transistors 234 and 236 are P-channel metal oxide semiconductor (PMOS) transistors and the transistors 238 and 240 are N-channel metal oxide semiconductor (NMOS) transistors. However, in other embodiments, these transistors 234, 236, 238 and 240 may be different types of transistors. The source of the PMOS transistor 234 is connected to the VDD terminal, while the drain of the PMOS transistor 234 is connected to the source of the PMOS transistor 236. The gate of the PMOS transistor 234 is connected to the bias circuit 244 to receive a first bias voltage Vbp. The drain of the PMOS transistor 236 is connected to the drain of the NMOS transistor 238. The source of the NMOS transistor 238 is connected to the drain of the NMOS transistor 240. The gates of the PMOS and NMOS transistors 236 and 238 are both connected to the input 230. The drains of the PMOS and NMOS transistors 236 and 238 are also connected to the output 232. The source of the NMOS transistor 240 is connected to ground. The gate of the NMOS transistor 240 is connected to the bias circuit 244 to receive a second bias voltage Vbn. The capacitor 242 is connected between the output 232 and ground.

The PMOS transistor 234 operates as a current source to conduct current, which is dependent on the Vbp bias voltage applied to the gate of the transistor 234. The NMOS transistor 240 also operates as a current source to conduct current, which is dependent on the Vbn bias voltage applied to the gate of the transistor 240. The PMOS and NMOS transistors 236 and 238 operate as an inverter switch 246 to turn on or off the current sources formed by the PMOS transistor 234 and the NMOS transistor 240. When the input signal received at the input 230 is low, the PMOS transistor 236 is on and the NMOS transistor 238 is off. As a result, the capacitor 242 will be charging up by a constant current source formed by the PMOS transistor 234. When the input signal received at the input 230 is high, the PMOS transistor 236 is off and the NMOS transistor 238 is on. As a result, the capacitor 242 will be discharging by a constant current source formed by the NMOS transistor 240. Thus, the capacitor 242 charges and discharges electrical current in response to the applied input signal received at the input 230 to produce an integrated signal in triangular pulse form on the output 232, which is the output signal of the charge pump circuit 220.

Figure 3:
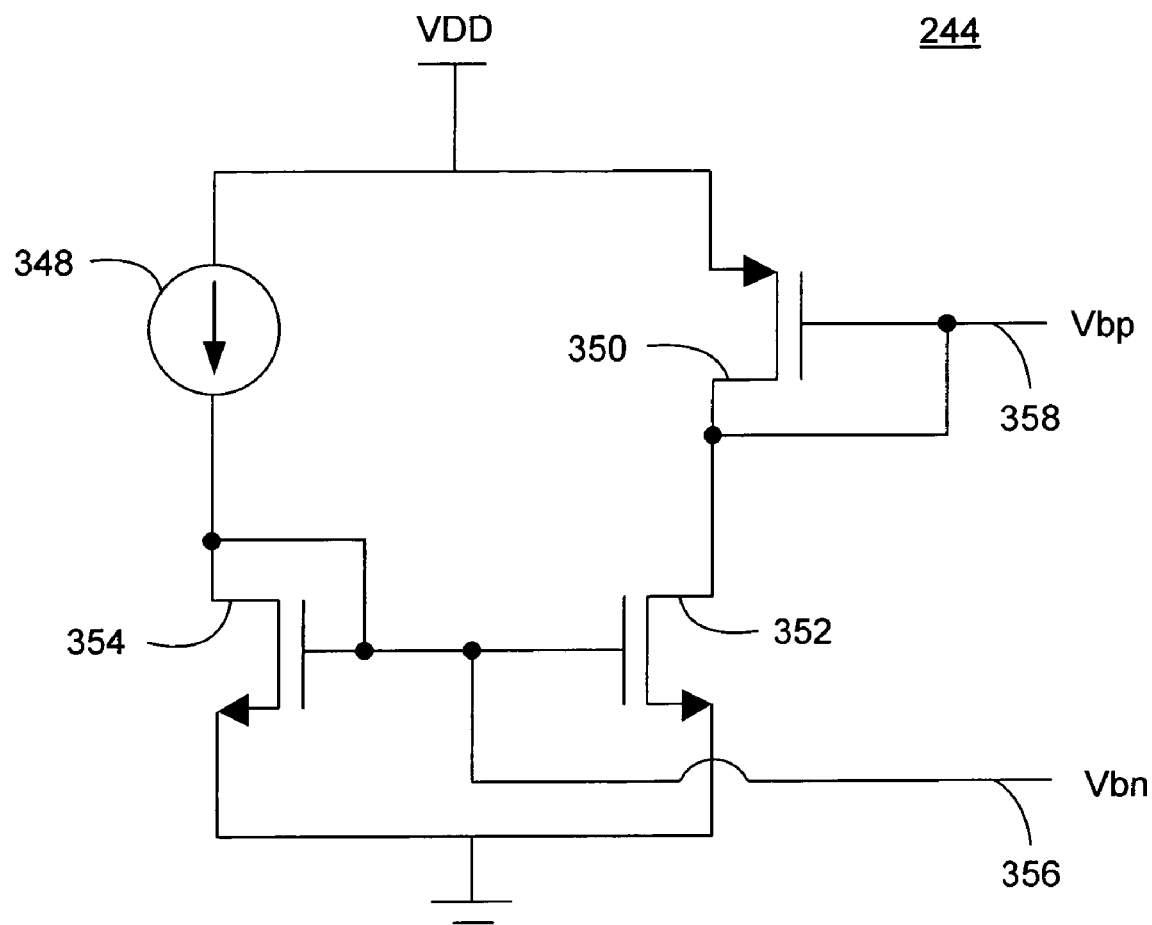
FIG. 3 is a circuit diagram of a bias circuit included in the demodulation unit of FIG. 2 in accordance with an embodiment of the invention.

Turning now to FIG. 3, the components of the bias circuit 244 in accordance with an embodiment of the invention are shown. The bias circuit 244 includes a current source 348 and transistors 350, 352 and 354. In this embodiment, the transistor 350 is a PMOS transistor and the transistors 352 and 354 are NMOS transistors. However, in other embodiments, these transistors 350, 352 and 354 may be different types of transistors. The current source 348 and the NMOS transistor 354 are connected in series between the VDD terminal and ground. The current source 348 is connected to the VDD terminal, and the NMOS transistor 354 is connected to ground. The drain of the NMOS transistor 354 is connected to the current source 348, while the source of the transistor 354 is connected to ground. The gate of the NMOS transistor 354 is connected to the drain of the transistor 354. The gate of the NMOS transistor 354 is also connected to an output terminal 356, which is connected to the gate of the NMOS transistor 240 shown in FIG. 2.

The PMOS and NMOS transistors 350 and 352 are also connected in series between the VDD terminal and ground. The source of the PMOS transistor 350 is connected to the VDD terminal, while the drain of the transistor 350 is connected to the drain of the NMOS transistor 352. The gate of the PMOS transistor 350 is connected to the drain of the transistor 350. The gate of the PMOS transistor 350 is also connected to an output terminal 358, which is connected to the gate of the PMOS transistor 234 shown in FIG. 2. The source of the NMOS transistor 352 is connected to ground. The gate of the NMOS transistor 352 is connected to the gate of the NMOS transistor 354, and thus, to the output terminal 356.

The bias circuit 244 operates to produce the Vbp bias voltage on the output terminal 358 to control the current source 234 of the charge pump circuit 220. The bias circuit 244 further operates to produce the Vbn bias voltage on the output terminal 356 to control the other current source 240 of the charge pump circuit 220. In an embodiment, the bias circuit 244 operates to produce the Vbp and Vbn bias voltages such that the bias voltage Vbp is higher than the bias voltage Vpn. Such bias voltages ensure that the charge pump circuit 220 output a desired integrated signal. The Vbp and Vbn bias voltages are dependent on the size of the components of the bias circuit 244. Thus, the Vbp and Vbn bias voltages can be adjusted by increasing and/or decreasing the size the PMOS and NMOS transistors 350, 352 and 354.

Turning back to FIG. 2, the second comparator 222 includes two inputs 260 and 262, and a single output 264. The input 262 is connected to the output 232 of the charge pump circuit 220 to receive the integrated signal. The input 260 is connected to receive a reference voltage signal Vref2. The Vref2 signal is used to convert the integrated signal into a demodulated signal in a rectangular pulse form. The demodulated signal is produced by outputting a high voltage, when the integrated signal is above the Vref2 reference signal, and outputting a low voltage, when the integrated signal is below the Vref2 reference signal. The Vref2 reference signal is chosen to remove portions of the integrated signal attributable to noise components. The hysteresis of the second comparator 222 about the Vref reference signal ensures that small voltage deviations do not erroneously trigger the second comparator 222.

Figure 4A:
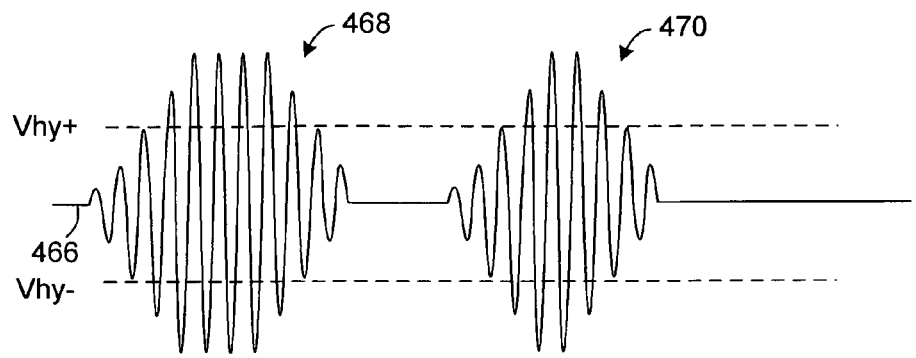
FIGS. 4A-4D are diagrams of a signal at different stages of a demodulation process, which is performed by the demodulation unit of FIG. 2, in accordance with an embodiment of the invention.
Figure 4B:
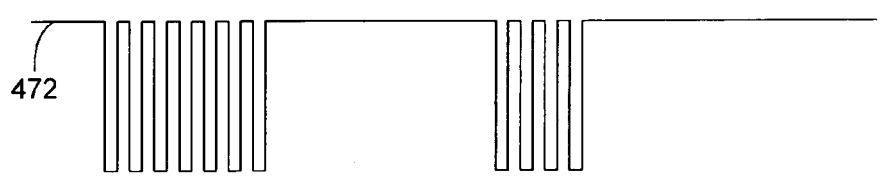

The demodulation process performed by the demodulation unit 110 of the infrared IR receiver 100 in accordance with an embodiment of the invention is now described with reference to FIGS. 4A-4D, as well as FIGS. 2 and 3. FIGS. 4A-4D illustrate an input signal at different stages of the demodulation process. As shown in FIG. 4A, an input signal 466 from the bandpass filter 108 is a waveform signal with positive and negative components. This input signal 466 includes a signal component 468 and a noise component 470. The input signal 466 is applied to the input 224 of the first comparator 218. The first comparator 218 provides an upper hysteresis threshold voltage Vhy+ and a lower hysteresis threshold voltage Vhy−, as shown in FIG. 4A. Using these threshold voltages, which are defined by the Vfef1 reference signal applied to the input 226 of the first comparator 218, the input signal 466 is converted into a signal 472 in a pulse form ("pulse signal") by the first comparator 218, as shown in FIG. 4B. The conversion from the input signal 466 to the pulse signal 472 is achieved by producing a high voltage signal at the output 228 of the first comparator 218 when the input signal 466 is above the upper Vhy+ threshold voltage and producing a low voltage signal at the output 228 when the input signal 466 is below the lower Vhy− threshold voltage. The pulse signal 472 is the output signal from the first comparator 218.

The input signal 466 of FIG. 4A is assumed to be an in-band signal. An out-band signal received from the bandpass filter 108 is attenuated such that the amplitude of the out-band signal is much lower than an in-band signal. Thus, the upper Vhy+ threshold voltage and the lower Vhy+ voltage can be set so that an out-band signal will remain within the upper Vhy+ threshold voltage and the lower Vhy+ voltage. As a result, no signal corresponding to the out-band signal will be output from the first comparator 218, effectively removing the out-band signal.

Figure 4C:
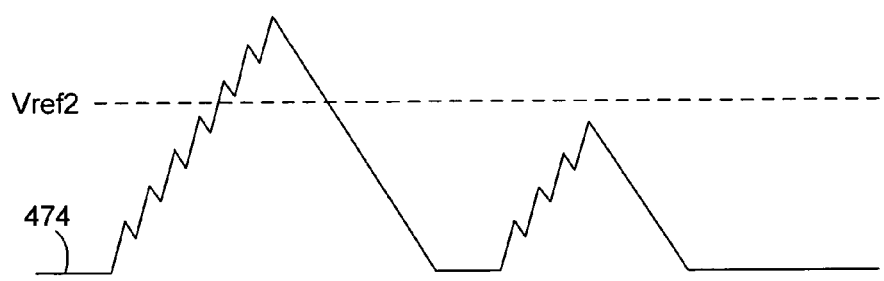

For the in-band signal, the pulse signal 472 from the first comparator 218 is received by the charge pump circuit 220 and applied to the inverter switch 246 of the charge pump circuit, i.e., the gates of the PMOS and NMOS transistors 236 and 238. The inverter switch 246 produces an inverted signal of the applied pulse signal 472 to convert the applied pulse signal into an integrated signal in a triangular pulse form 474, as shown in FIG. 4C. The portions of the pulse signal s 472 corresponding to the signal and noise components 468 and 470 charge the capacitor 242 of the charge pump circuit 220 with current to produce the rising edges of the integrated signal 474. After the signal and noise portions of the pulse signal 472, the capacitor 242 of the charge pump circuit 220 discharges the stored current to produce the falling edges of the integrated signal 474. The slope of the rising and falling edges of the integrated signal 474 depends on the Vbp and Vbn bias signals applied to the current sources 234 and 240 of the charge pump circuit 220, i.e., the gates of the PMOS and NMOS transistors 234 and 240. A noise component of an input in-band signal is typically shorter in duration than a signal component of the input signal. Thus, a triangular pulse of an integrated signal corresponding to a noise component of an input signal is shorter than a triangular pulse of the integrated signal corresponding to a signal component of the input signal. As illustrated in FIG. 4C, the triangular pulse of the integrated signal 474 corresponding to the noise component is shorter than the triangular pulse of the integrated signal corresponding to the signal component.

Figure 4D:

The integrated signal 474 from the charge pump circuit 220 is then applied to the input 262 of the second comparator 222. The integrated signal 474 is compared with the Vref2 reference signal applied to the other input 260 of the second comparator 222, as illustrated in FIG. 4C. Using the Vref2 reference signal, the integrated signal 474 is converted into an integrated signal 476 in a rectangular pulse form, as shown in FIG. 4D, which is the demodulated signal of the input signal 466. The conversion from the integrated signal 474 to the integrated signal 476 is achieved by producing a high voltage signal at the output 264 of the second comparator 222 when the integrated signal is higher than the Vref2 reference signal and producing a low voltage signal at the output 264 when the integrated signal is lower than the Vref2 reference signal.

Figure 5:
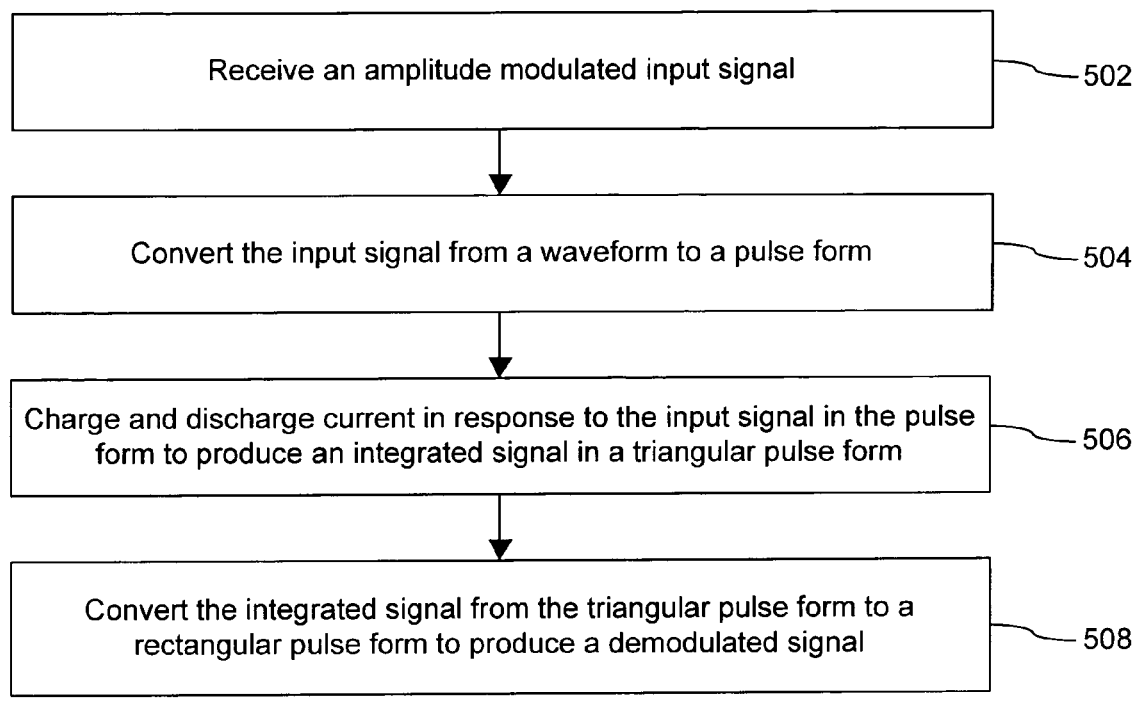
FIG. 5 is a flow diagram of a method for demodulating amplitude modulated signals in accordance with an embodiment of the invention.

A method for demodulating amplitude modulated signals in accordance with an embodiment of the invention is described with reference to a flow diagram of FIG. 5. At block 502, an amplitude modulated input signal is received. The input signal may be modulated using amplitude shift keying. Next, at block 504, the input signal is converted from a waveform to a pulse form. In an embodiment, the input signal is converted to a pulse form using upper and lower thresholds within a first comparator with hysteresis. Next, at block 506, current is charged and discharged in response to the input signal in the pulse form to produce an integrated signal in a triangular pulse form. Next, at block 508, the integrated signal is converted from the triangular pulse form to a rectangular pulse form to produce a demodulated output signal. In an embodiment, the integrated signal is converted to a rectangular pulse form using a threshold signal within a second comparator with hysteresis.

Although specific embodiments of the invention have been described and illustrated, the invention is not to be limited to the specific forms or arrangements of parts so described and illustrated. The scope of the invention is to be defined by the claims appended hereto and their equivalents.

What is claimed is:

1. A system for demodulating amplitude modulated signals, said system comprising:

a first comparator configured to convert an amplitude modulated input signal from a waveform to a pulse form using upper and lower threshold signals;

a charge pump circuit electrically connected to said first comparator, said charge pump circuit being configured to charge and discharge current in response to said input signal in said pulse form to produce an integrated signal in a triangular pulse form, said charge pump circuit including an inverter switch connected to said first comparator to receive said input signal in said pulse form and a capacitor connected to said inverter switch to charge and discharge said current to produce said integrated signal; and a second comparator electrically connected to said charge pump circuit to receive said integrated signal, said second comparator being configured to convert said integrated signal from said triangular pulse form to a rectangular pulse form using a reference signal to produce a demodulated output signal, wherein said charge pump circuit comprises first and second current sources and said inverter switch connected in series between a first voltage terminal and a second voltage terminal.

2. The system of claim 1 wherein said charge pump circuit further comprises a bias circuit to provide a first bias signal to said first current source and a second bias signal to said second current source, said first bias signal being a higher voltage signal than said second bias signal.

3. The system of claim 1 wherein each of said first and second current sources of said charge pump circuit includes a transistor, and wherein said inverter switch includes a pair of transistors.

4. The system of claim 3 wherein said first current source includes a PMOS transistor, said second current source includes an NMOS transistor and said inverter switch includes a pair of PMOS and NMOS transistors.

5. The system of claim 1 wherein said first comparator is configured to generate a high output signal when said input signal is above said upper threshold signal and a low output signal when said input signal is below said lower threshold signal.

6. The system of claim 1 wherein said second comparator is configured to generate a high output signal when said integrated signal from said charge pump circuit is higher than said reference signal and a low output signal when said integrated signal from said charge pump circuit is lower than said reference signal.

7. The system of claim 1 wherein said first and second comparators are comparators with hysteresis.

8. The system of claim 1 further comprising:
  a photodetector to receive an amplitude modulated optical signal and generate an electrical signal in response to said optical signal to produce said amplitude modulated input signal; and
  a bandpass filter electrically connected to said photodetector, said bandpass filter being configured to transmit and attenuate components of said input signal based on frequency.

9. A system for demodulating amplitude modulated signals, said system comprising:
  a photodetector to receive an amplitude modulated optical signal and generate an electrical input signal in response to said optical signal;
  a bandpass filter electrically connected to said photodetector, said bandpass filter being configured to transmit and attenuate components of said input signal based on frequency; and
  a demodulation unit electrically connected to said bandpass filter, said demodulation unit being configured to convert said input signal from said bandpass filter from a waveform to a pulse form, said demodulation unit being further configured to charge and discharge current in response to said input signal in said pulse form to produce an integrated signal in a triangular pulse form, said demodulation unit being further configured to convert said integrated signal from said triangular pulse form to a rectangular pulse form to produce a demodulated output signal, said demodulation unit comprising:
  a first comparator configured to convert said input signal from said waveform to said pulse form using upper and lower threshold signals;
  a charge pump circuit electrically connected to said first comparator, said charge pump circuit being configured to charge and discharge said current in response to said input signal in said pulse form to produce said integrated signal in said triangular pulse form, said charge pump circuit including an inverter switch connected to said first comparator to receive said input signal in said pulse form and a capacitor connected to said inverter switch to charge and discharge said current to produce said integrated signal; and
  a second comparator electrically connected to said charge pump circuit to receive said integrated signal, said second comparator being configured to convert said integrated signal from said triangular pulse form to said rectangular pulse form using a reference signal to produce said demodulated output signal,
  wherein said charge pump circuit comprises first and second current sources and said inverter switch connected in series between a first voltage terminal and a second voltage terminal.

10. The system of claim 9 wherein said charge pump circuit further comprises a bias circuit to provide a first bias signal to said first current source and a second bias signal to said second current source, said first bias signal being a higher voltage signal than said second bias signal.

11. The system of claim 9 wherein each of said first and second current sources of said charge pump circuit includes a transistor, and wherein said inverter switch includes a pair of transistors.

12. The system of claim 9 wherein said first and second comparators are comparators with hysteresis.

13. A method for demodulating amplitude modulated signals, said method comprising:
  receiving an amplitude modulated input signal; converting said input signal from a waveform to a pulse form;
  applying said input signal in said pulse form to an inverter switch of a charge pump circuit to produce an inverted signal;
  charging and discharging current in response to said inverted signal using a capacitor connected to said inverter switch to receive said inverted signal and to produce an integrated signal in a triangular pulse form,
  wherein said charging and discharging said current comprises utilizing first and second current sources connected in series with said inverter switch; and
  converting said integrated signal from said triangular pulse form to a rectangular pulse form to produce a demodulated output signal.

14. The method of claim 13 wherein said converting said input signal includes converting said input signal from said waveform to said pulse forum using upper and lower threshold signals, including generating a high output signal when said input signal is above said upper threshold signal and a low output signal when said input signal is below said lower threshold signal.

15. The method of claim 13 wherein said converting said integrated signal includes converting said integrated signal from said triangular pulse form to said rectangular pulse form using a reference signal to produce said demodulated output signal, including generating a high output signal when said integrated signal in said triangular pulse form is higher than said reference signal and a low output signal when said integrated signal in said triangular pulse form is lower than said reference signal.

16. The method of claim 13 farther comprising:
  generating said input signal as an electrical signal in response to received amplitude modulated optical signal; and
  bandpass filtering said input signal to transmit and attenuate components of said input signal based on frequency.

* * * * *